(12) United States Patent
Yechuri

(10) Patent No.: US 7,623,995 B2
(45) Date of Patent: Nov. 24, 2009

(54) METHOD OF EXTRACTING A SEMICONDUCTOR DEVICE COMPACT MODEL

(76) Inventor: Sitaramarao Srinivas Yechuri, 1031 Folsom Ranch Dr., Apt. #103, Folsom, CA (US) 95630

( * ) Notice: Subject to any disclaimer, the term of this patent is extended or adjusted under 35 U.S.C. 154(b) by 864 days.

(21) Appl. No.: 11/149,825

(22) Filed: Jun. 11, 2005

(65) Prior Publication Data

US 2006/0282802 A1  Dec. 14, 2006

(51) Int. Cl.
G06F 7/60 (2006.01)
G06F 17/10 (2006.01)
G06F 9/45 (2006.01)
G06F 17/50 (2006.01)
G06F 19/00 (2006.01)

(52) U.S. Cl. .................. 703/2; 716/4; 716/5; 716/6; 716/7; 702/57; 702/65

(58) Field of Classification Search ............ 703/2; 702/57, 65; 716/4–7
See application file for complete search history.

(56) References Cited

U.S. PATENT DOCUMENTS

| 6,314,390 | B1 | 11/2001 | Bittner |
| 6,397,172 | B1 | 5/2002 | Gurney |
| 6,560,568 | B1 | 5/2003 | Singhal |
| 6,779,157 | B2 | 8/2004 | Kondo |
| 2005/0267851 | A1* | 12/2005 | Baba et al. ............... 706/13 |

OTHER PUBLICATIONS

Josef Watts, Calvin Bittner, Douglas Heaberlin, James Hoffmann, "Extraction of Compact Model Parameters for ULSI MOSFETS Using a Genetic Algorithm" 1999, IBM Microelectronics, Essex Junction, VT USA, University of Vermont, Burlington, VT, 4 pages un-numbered.*

* cited by examiner

Primary Examiner—Paul Rodriguez
Assistant Examiner—Dwin McTaggart Craig

(57) ABSTRACT

This invention is a method of extracting a semiconductor device compact model by using knowledge of the equations used inside the compact model. Starting by fitting a small subset of the model parameters, the remaining model parameters are fitted and as each new subset of model parameters are fitted, the previously fitted model parameters are adjusted to compensate for the changes introduced due to the currently optimized parameters. This invention details the method of making these adjustments.

3 Claims, No Drawings

METHOD OF EXTRACTING A SEMICONDUCTOR DEVICE COMPACT MODEL

TECHNICAL FIELD OF THE INVENTION

This invention relates generally to electronic testing and characterizing of semiconductor IC processes. More specifically it relates to extraction of compact model parameters from semiconductor device measurement data.

BACKGROUND ART

In U.S. Pat. No. 6,779,157 Kondo et al. outline a method use a simulation model to simulate in and calculate local processes that occur during device fabrication and uses the resulting electrical behavior as data to extract BSIM3 model parameters. So the invention is to use the results of simulating a semiconductor device as if it were real data.

In U.S. Pat. No. 6,560,568 Singhal et al. outline a method wherein the results of multiple measurements are itemized in a matrix and the standard deviation is obtained and then the electrical parameters are obtained after normalizing the columns to have a mean of zero and a variance of one.

In U.S. Pat. No. 6,397,172 Gurney et al. outline a method wherein the simulation model is regenerated as required based on the effective simulation conditions and if necessary relevant measurement data relevant to the effective operating conditions are used in regenerating the model. The method also allows selecting a model based on the effective simulation conditions.

In U.S. Pat. No. 6,314,390 Bittner et al. outline a method of obtaining vectors of model parameters from measured data and applying genetic operators and meta evolution operators to create a new population of vectors from which vectors of best fitness are selected.

In a publication entitled "Pre-Silicon Parameter Generation Methodology Using BSIM3 for Circuit Performance-Oriented Device Optimization", IEEE Transactions on Semiconductor Manufacturing, Vol. 14, No. 2, May 2001, Miyama et al. outline a method to extract BSIM3 model parameters before device fabrication. The method is to start with a subset of the BSIM3 parameters considered to be critical and to divide that set into two types namely those which change from generation to generation and those that remain the same. Some of these critical parameters are calculated and some are extracted from data so that finally BSIM3 model parameters are obtained before device fabrication.

SUMMARY OF THE INVENTION

There are more than 60 parameters in the BSIM3 model and they cannot all be optimized at the same time. Yet the correct value of many of these parameters depends upon the value of other parameters. So at any point in the optimization sequence you will have a set K of parameters which have been optimized and a set P whose values are yet to be determined. So in this suggested extraction method, parameters from the set K will have to be corrected when parameters from the set P are being optimized. The following is an example.

$$V_{th} = V_{th0} - D_{VT0}[e^A + 2e^{2A}](V_{bi} - \phi_s) \quad (1)$$

$$A = -D_{VT1}\frac{L_{eff}}{2l_t} \quad (2)$$

Consider the case of the threshold voltage $V_{th}$ using the gate characteristic at a $V_{ds}$ of 50 mV and zero back bias. When $V_{th0}$ is set using the long channel gate characteristic, $D_{VT0}$ and $D_{VT1}$ are unknown. So a value of $V_{th0}$ is set using $D_{VT0}=0$. Then when you optimize either $D_{VT0}$ or $D_{VT1}$, at each iteration you must first increase $V_{th0}$ from it's original optimized value by the amount C given by equations 3, 4 where $L_{effLC}$ is the long channel effective gate lenth, because otherwise the long channel $V_{th}$ is affected. This correction will not affect the stability of the Levenburg-Marquardt algorithm.

$$C = D_{VT0}[e^D + 2e^{2D}](V_{bi} - \phi_s) \quad (3)$$

$$D = -D_{VT1}\frac{L_{effLC}}{2l_t} \quad (4)$$

BEST MODE FOR CARRYING OUT THE INVENTION

In order to accurately and repeatably extract the BSIM3 model, it is important to compute some of the parameters by solving the model equations using the intermediate variables used inside the model. Obtaining the mobility parameters is done this way as shown below.

In the absence of back-bias all three mobility models in the BSIM3 model have the form of equation 5 where the most often used P is the equation 6. We use three data points from $F_jG_0B_0T_n$ at $V_{gs}=2\times V_{th}$, $V_{gs}=0.5\times(V_{dd}+2\times V_{th})$ and $V_{gs}=V_{dd}$ because the current and electric field are sufficiently low as to avoid the effects of source/drain resistance and mobility degradation.

These 3 points are known to be in the linear region. The effective mobilities $\mu_{eff\_1}$, $\mu_{eff\_2}$ & $\mu_{eff\_3}$ needed at the 3 points points are obtained directly from the model by overriding the intermediate variable $\mu_{eff}$ inside the model code incrementally until the required $I_d$ is obtained. In this patent application overriding means to substitute your estimated value in place of the value the intermediate variable would otherwise have had. Then you will have the 3 values $\mu_{eff\_1}$, $\mu_{eff\_2}$ & $\mu_{eff\_3}$ and 3 equations of the form of equation 5 at the 3 values $P_1$, $P_2$ & $P_3$, which are solved by matrix inversion to obtain $\mu_0$, $\mu_a$ and $\mu_b$.

$$\frac{\mu_0}{\mu_{eff\_n}} - P_n \cdot U_a - P_n^2 \cdot U_b = 1 \quad (5)$$

$$P_n = \frac{V_{gsteff} + 2V_{th}}{T_{ox}} \quad (6)$$

There are 16 optimization steps in this extraction method. As the parameters are computed in each step, they are set at that value for the following steps. Since the LMA allows a parameter to adjust the significance of each data point, one can use a significance of the drain current at each data point divided by the smallest drain current of the data set. This will allow all data points to be optimized equally. This is done in every LMA iteration.

The first step is to calculate the effective threshold voltage of the 5 MOSFETs from the 15 gate characteristics at minimum $V_{ds}$ which is obtained from the max slope m and the $I_m$ and $V_{gs}$ at that point in the gate characteristic as $$V_{th} = V_{gs} - \frac{I_m}{m} - \frac{V_{ds}}{2} \quad (7)$$

Set the parameter $V_{th0}$ to the $V_{th}$ obtained for the FET #0 from the curve $F_0G_0B_0T_0$.

Now we initialize several parameters to their starting values. The parameters set to zero are $U_a$, $U_b$, $U_c$, $P_{rwg}$, $P_{dibl1}$, $P_{diblb}$, $C_{dsc}$, $C_{dscd}$, $C_{dscb}$, $N_{lx}$, $D_{VT0}$, $D_{VT1}$, $D_{VT2}$, $K_{3b}$, $D_{VT0w}$, $Eta_0$, $Eta_b$, $A_{gs}$, $B_0$, $B_1$, $N_{gate}$, $K_2$, $A_1$, $D_{VT2w}$, $D_{VT0w}$, $C_{it}$, $V_{off}$ and $N_{factor}$. $T_{oxm}$ is set to the oxide thickness, $\mu_0 = 0.1$, $R_{dsw} = 200$, $W_r = 1$, $V_{sat} = 150000$, $P_{vag} = 0.1$, $P_{clm} = 0.3$, $P_{dibl2} = 0.2$, $D_{rout} = 100$, $P_{scbe1} = 4.24 \times 10^{10}$, $P_{scbe2} = 1 \times 10^{-5}$, $K_3 = -2.6$, $W_0 = 1 \times 10^{-7}$, $D_{VT1w} = 1$, $D_{sub} = 1$, $K_{eta} = -0.047$, Delta=0.01, $K_1 = 0.5$, $A_2 = 1$ and $V_{bm} = -1.1 \times V_{dd}$.

Now using the drain currents $I_j$ of the $j^{th}$ FET at the highest $V_{gs}$ point on the curves $F_0G_0B_0T_0$, $F_1G_0B_0T_0$, $F_2G_0B_0T_0$, $F_3G_0B_0T_0$, you calculate $L_{int}$ and $W_{int}$ as follows. Increment $W_{int}$ from it's minimum expected value to it's maximum expected value in an outer loop in increments of a few nm, and increment $L_{int}$ from it's minimum expected value to it's maximum expected value in an inner loop in increments of a few nm and compute the error for each $j^{th}$ FET as compared to the long-wide FET #0 as in eqn 8.

$$err = \left| 1 - \frac{I_j \cdot L_{eff\!j}}{W_{eff\!j}} \cdot \frac{W_{eff\!0}}{I_0 \cdot L_{eff\!0}} \right| \quad (8)$$

$$L_{eff} = L_{drawn} - (2 \times L_{int}) \quad (9)$$

$$W_{eff} = W_{drawn} - (2 \times W_{int}) \quad (10)$$

For each combination of $W_{int}$ and $L_{int}$ select the worst err of the FETs #0, #1, #2 and #3, and seek the combination of $W_{int}$ and $L_{int}$ that yield the smallest worst err for the FETs. This is now the correct $W_{int}$ and $L_{int}$ that is needed.

Now we use the LMA to optimize $V_{off}$, $C_{it}$, $A_0$, $A_{gs}$, while computing the parameters $\mu_0$, $U_a$ and $U_b$ from the $F_0G_0B_0T_0$ characteristic. The data used are the 3 long channel gate characteristics with zero back-bias i.e., $F_0G_0B_0T_0$, $F_0G_1B_0T_0$ & $F_0G_2B_0T_0$.

For each trial set of $V_{off}$, $C_{it}$, $A_0$ & $A_{gs}$ the mobility parameters $\mu_0$, $U_a$ and $U_b$ are computed prior to computing the error used by the LMA. Now of these 7 parameters that were optimized $C_{it}$ & $A_0$ will be updated in subsequent optimization steps but the other 5 parameters are at their final values. Store $SC_{it} = C_{it}$.

Now we use the LMA to optimize $U_c$, $N_{factor}$, $K_1$, $K_2$, $K_{eta}$, $A_0$. The parameter $C_{it}$ is corrected. The data points used are all the gate characteristics for the FET #0 i.e., $F_0G_0B_0T_0$, $F_0G_1B_0T_0$, $F_0G_2B_0T_0$, $F_0G_0B_1T_0$, $F_0G_1B_1T_0$, $F_0G_2B_1T_0$, $F_0G_0B_2T_0$, $F_0G_1B_2T_0$ and $F_0G_2B_2T_0$. $C_{it}$ is corrected in each iteration of the LMA, prior to computing the error used by the LMA, using the equation 11, where $SC_{it}$ is the stored value of $C_{it}$ at the end of Step 4.

$$C_{it} = SC_{it} - N_{factor} \sqrt{\frac{q \cdot \epsilon_{si} \cdot N_{ch}}{2 \cdot \phi_s}} \quad (11)$$

Now store for future use, $GC_{it} = C_{it}$ and the long-channel threshold voltage $GV_{th} = V_{th}$.

Next, temporary reference values of the parameters $D_{VT0}$ & $C_{dsc}$ are obtained which will be used in the next step. No correction needs to be made because these values of $D_{VT0}$ & $C_{dsc}$ are only temporary. First set $D_{VT1} = 0.02$, which will activate $D_{VT0}$ & $C_{dsc}$. $D_{VT2}$ is already zero.

Now the LMA is used to optimize the parameters $D_{VT0}$ & $C_{dse}$ using the sub-threshold region of the curve $F_3G_0B_0T_0$, so that the $V_{th}$ and the sub-threshold swing is adjusted. At this point you have a combination of $D_{VT0}$, $D_{VT1}$ & $C_{dse}$ which fits the sub-threshold region of the shortest channel device and also you know that if $D_{VT0}$ & $C_{dsc}$ are zero, the sub-threshold region of the longest channel device is fitted.

Store the values $MC_{it} = C_{it}$ and $MC_{dsc} = C_{dsc}$. A common reference bias point $B_{ref}$ is chosen on the gate curves $F_0G_0B_0T_0$, $F_1G_0B_0T_0$, $F_2G_0B_0T_0$ & $F_3G_0B_0T_0$ which has a $V_{gs}$ slightly above threshold, zero $V_{bs}$ and the minimum $V_{ds}$. This $B_{ref}$ is our reference for the corrections. Now at $B_{ref}$ the following reference values are recorded for FET #3 from the length correction term in the $V_{th}$ eqn in the BSIM3 model. Also store the $V_{th}$ obtained as $V_{th\_SC}$.

$$Q_{SC} = P(1 + (2 \cdot P)) \quad (12)$$

$$P = e^{\frac{-D_{VT1} \cdot L_{eff}}{2 \cdot l_t}} \quad (13)$$

$$T_{1\_SC} = K_{1ox}\left(\sqrt{1 + \frac{N_{lx}}{L_{eff}}} - 1\right)\sqrt{\phi_s} \quad (14)$$

Similarly bias the FET #0 at $B_{ref}$ and store the corresponding values of $Q_{LC}$, $T_{1\_LC}$ and $V_{th\_LC}$. LC stands for long-channel and SC stands for short-channel Upto here we only considered the long-channel or short-channel devices one at at time. Now we consider all four devices FET #0, FET #1, FET #2 & FET #3, optimizing $D_{VT1}$ & and $N_{lx}$, while correcting the parameters $C_{dsc}$, $C_{it}$ & $D_{VT0}$. The data to optimize on is the sub-threshold region of the curves $F_0G_0B_0T_0$, $F_1G_0B_0T_0$, $F_2G_0B_0T_0$ & $F_3G_0B_0T_0$. First perform the corrections given by equations 15, 16 & and 17.

$$C_{dsc} = \frac{MC_{it} + (MC_{dsc} \cdot Q_{SC}) - GC_{it}}{Q_{SC} - Q_{LC}} \quad (15)$$

$$C_{it} = GC_{it} - (C_{dsc} \cdot Q_{LC}) \quad (16)$$

$$D_{VT0} = \frac{V_{th\_SC} - T_{1\_SC} - V_{th\_LC} + T_{1\_LC}}{(Q_{LC} - Q_{SC})(V_{bi} - \phi_s)} \quad (17)$$

In order to keep the fit of the long channel accurate, after these corrections are performed, using these new values correct the base $V_{th0}$ using the equation 18 before computing the error in each LMA iteration. The value of P is the same as in the equation 13.

$$V_{th0} = GV_{th0} - T_{1\_LC} + \Delta_{vth} \quad (18)$$

$$T_{1\_LC} = K_{1ox}\left(\sqrt{1 + \frac{N_{lx}}{L_{eff}}} - 1\right)\sqrt{\phi_s} \quad (19)$$

$$\Delta_{vth} = D_{VT0} \cdot P(1 + (2 \cdot P))(V_{bi} - \phi_s) \quad (20)$$

So in this optimization step the long channel device FET #0 is unaffected, the sub-threshold slope and the $V_{th}$ of the short-channel devices FETs #1, #2 & #3 are optimized.

Now we fit the high $V_{ds}$ short channel behavior. The data used is the sub-threshold region of the highest $V_{ds}$ gate curve $F_3G_2B_0T_0$. The parameter $D_{sub}=0.02$ for this step. No corrections are made. The parameters optimized are $P_{dibl2}$, $P_{clm}$, $A_2$, Eta$_0$, $V_{sat}$ & $C_{dscd}$.

Next the entire curve $F_3G_2B_0T_0$ is optimized for the parameters $R_{dsw}$, $P_{rwg}$, $A_2$, $P_{vag}$, $V_{sat}$ & $A_1$.

Finally all three short channel gate curves $F_3G_0B_0T_0$, $F_3G_1B_0T_0$ & $F_3G_2B_0T_0$ are optimized for the parameters $R_{dsw}$, $P_{dibl2}$, $P_{clm}$, $A_2$, Eta$_0$, $V_{sat}$, $C_{dscd}$, $P_{rwg}$, $P_{vag}$ & $A_1$. No corrections are made. In all three steps above we only use the curves with $V_{bs}=0$, because no back-bias parameters are being fitted.

In the previous step the shortest channel gate curves were optimized with $D_{sub}=0.02$. Now the gate characteristics of the devices FET #1 & #2 are optimized while $P_{dibl1}$ & and Eta$_0$ are corrected, so as to keep the fit of the FET #0 the same. The parameters fitted are $P_{dibl2}$, $D_{rout}$ & $D_{sub}$. The data used are all the gate curves for FET #0, #1 & #2, with $V_{bs}=0$. The initial values of $P_{dibl2}$ and Eta$_0$ are stored in SP$_{dibl2}$ & SEta$_0$ respectively. We also store the value of T given by the equation 21 as ST.

$$T = P_1(1 + (2 \cdot P_1)) \quad (21)$$

$$P_1 = e^{\frac{-D_{sub} \cdot L_{eff}}{2 \cdot l_t}} \quad (22)$$

Next a common reference bias point $B_{ref}$ is chosen with zero $V_{bs}$, and a $V_{gs}$ & $V_{ds}$ above $V_{th0}$. This is used to make the corrections. For each set of trial values of $P_{dibl2}$, $D_{rout}$ & $D_{sub}$, obtain the initial value of T of equations 21, 22 & $\theta_{rout}$ of equations 23, 24 and then the corrections performed before computing the error in each LMA iteration are the equations 25, 26.

$$\theta_{rout} = P_{dibl1} \cdot P_2(1 + (2 \cdot P_2)) + P_{dibl2} \quad (23)$$

$$P_2 = e^{\frac{-D_{rout} \cdot L_{eff}}{2 \cdot l_t}} \quad (24)$$

$$P_{dibl1} = \frac{SP_{dibl2} - P_{dibl2}}{\theta_{rout}} \quad (25)$$

$$Eta_0 = \frac{SEta_0 \cdot ST}{T} \quad (26)$$

Now the back bias dependence of the $V_{th}$ and the subthreshold swing at short gate length is fitted. The parameters $C_{dscb}$ & Eta$_b$ are optimized using the subthreshold region of the short channel gate characteristics $F_3G_2B_2T_0$ & $F_3G_0B_0T_0$. No corrections are made.

Now the parameter $K_{T1}$ is optimized and the parameters $\mu_{te}$, $U_{a1}$ & $U_{b1}$ are computed. The data used is the long channel low $V_{ds}$ gate characteristic with zero $V_{bs}$ at high temperature $F_0G_0B_0T_1$.

For each value of $K_{T1}$, compute the required mobility $M\mu_0$, $MU_a$ & $MU_b$ from the $F_0G_0B_0T_1$ characteristic using the mobility computation method. Then compute the parameters $\mu_{te}$, $U_{a1}$ & $U_{b1}$ from the equations 27, 28 & 29 respectively.

$$\mu_{te} = \frac{\ln[M\mu_0/\mu_0]}{\ln[T_{hot}/T_{cold}]} \quad (27)$$

$$U_{a1} = \frac{MU_a - U_a}{[T_{hot}/T_{cold}] - 1} \quad (28)$$

$$U_{b1} = \frac{MU_b - U_b}{[T_{hot}/T_{cold}] - 1} \quad (29)$$

The error is computed at each step and the combination of $K_{T1}$, $\mu_{te}$, $U_{a1}$ & $U_{b1}$ giving the least error is chosen.

Now the parameters $K_{T2}$ and & $U_{c1}$ are optimized using the $F_0G_0B_2T_1$ long channel gate characteristic at low $V_{ds}$, high $V_{bs}$ and high temperature. This optimizes the $V_{th}$ and mobility dependence on back-bias at high temperatures.

Next the parameter $K_{T1l}$ is optimized using the sub-threshold region of the $F_0G_0B_0T_1$, $F_1G_0B_0T_1$, $F_2G_0B_0T_1$ & $F_3G_0B_0T_1$ gate characteristics.

Now the change in saturation velocity and source/drain resistance with increase in temperature is fitted. So the parameters $A_T$ & $P_{rt}$ are optimized using the high $V_{ds}$, zero $V_{bs}$, high temperature long channel gate characteristic $F_0G_2B_0T_1$.

Now the narrow-width effect is fitted by the LMA using the device FET #4. The parameters to be optimized are $K_3$ & $W_0$. Start by storing the value of $V_{th0}$ at the beginning of this step as the variable $GV_{th0}$. Since the correction to $V_{th}$ that we make for the narrow width FET #4, will also affect the $V_{th}$ of the devices FET #0, #1, #2 & #3 which have already been optimized, a correction to the $V_{th0}$ will have to be performed.

$$V_{th0} = GV_{th0} - \frac{K_3 \cdot T_{ox} \cdot \phi_s}{W_{eff\_LC} + W_0} \quad (30)$$

The data to be optimized to is the gate characteristic $F_4G_0B_0T_0$. For each trial set of $K_3$ & $W_0$, correct the value of $V_{th0}$ using the equation 30, where $W_{eff\_LC}$ is the $W_{eff}$ of the long channel device, before computing the error in the LMA. In this way the $V_{th}$ of the devices FET #0, #1, #2 & #3 are unaffected by the new values of $K_3$ & $W_0$.

Now the back-bias dependence of the narrow-width effect is fitted by the LMA using the device FET #4. Start by storing the value of $K_2$ at the beginning of this step as the variable $GK_2$.

$$K_2 = GK_2 + \frac{K_{3b} \cdot T_{ox} \cdot \phi_s}{W_{eff\_LC} + W_0} \quad (31)$$

The data to be optimized to is the gate characteristic $F_4G_0B_2T_0$. The parameter optimized is $K_{3b}$. For each trial value of $K_{3b}$, correct the value of $K_2$ using the equation 31, where $W_{eff\_LC}$ is the $W_{eff}$ of the long channel device, before computing the error in the LMA.

Now the reverse narrow-width effect is fitted. The parameters $D_{VT0w}$, $D_{VT1w}$ & $D_{VT2w}$ are optizited using the LMA.

The data points used are the low $V_{ds}$ gate characteristics $F_0G_0B_0T_0$, $F_0G_0B_1T_0$, $F_0G_0B_2T_0$, $F_3G_0B_0T_0$, $F_3G_0B_1T_0$, $F_3G_0B_2T_0$, $F_4G_0B_0T_0$, $F_4G_0B_1T_0$, $F_4G_0B_2T_0$, $F_5G_0B_0T_0$, $F_5G_0B_1T_0$ & $F_5G_0B_2T_0$. It is important to set an upper limit to the parameter $D_{VT1w}$.

What is claimed is:

1. A method of simulating the operation of a fabricated integrated circuit consisting of one or more devices using a simulator which includes a compact simulation model comprising a set of parameters and equations to perform mathematical calculations to model a device, comprising the steps of:

measuring the electrical characteristics on one or more devices in the fabricated circuit, selecting a subset G of the electrical characteristics to optimize, setting the values of the remaining set P of model parameters so as to minimize or nullify their effect on the characteristics yielded by the model, optimizing the set K of parameters in order that the model yields characteristics whose numerical value best approximates the subset G of the electrical characteristics for the devices, storing the optimized values of the set K of parameters as a data Q, further selecting a set M of model parameters from the set P pf model parameters, to optimize, further selecting a subset R of the electrical characteristics to optimize, optimizing the set M in order that the model yields characteristics whose numerical value best approximates the subset R, while simultaneously correcting values of the set K based on characteristics G and the values used in optimization of the set M and the data Q such that the new value of each parameter in K is computed from it's value in the data Q and such that the change in the values of the set K exactly counteracts the effect of the change in the values of the set M when the model is evaluated in the subset G of electrical characteristics, such that the fit of the model over G is exactly the same as when the data Q was stored.

2. The method of claim 1 where the electrical characteristics of the devices are not measured but instead are mathematically generated.

3. A method of simulating the operation of a fabricated integrated circuit consisting of one or more devices using a simulator which includes a compact simulation model comprising a set of parameters and equations to perform mathematical calculations to model a device, comprising the steps of:

measuring the electrical characteristics of one or more devices in the fabricated integrated circuit, selecting a subset G of the electrical characteristics to optimize, selecting an initial set K of model parameters to optimize, setting the values of the remaining set P of model parameters so as to minimize or nullify their effect on the characteristics yielded by the model, optimizing the set K of parameters in order that the model yields characteristics whose numerical value best approximates the subset G of the electrical characteristics for the devices, storing the optimized values of the set K of parameters as a data Q, storing the obtained values of variables used inside the compact model as the data F, further selecting a set M of model parameters from the set P of model parameters to optimize, further selecting a subset R of the electrical characteristics to optimize, optimizing the set M in order that the model yields characteristics whose numerical value best approximates the subset R, while simultaneously correcting the values of the set K based on the characteristics G and the values used in the optimization of the set M and the data Q such that the new value of each parameter K is computed from a mathematical relationship between the members of the set K of parameters and the members of the set M of parameters when certain variables used inside the compact model are maintained at their value in the data F and such that the change in the values of the set K exactly counteracts the effect of the change in the values of the set M when the model is evaluated in the subset G of electrical characteristics, such that the fit of the model over G is exactly the same as when the data Q was stored.

* * * * *